United States Patent
Baek et al.

(10) Patent No.: US 9,589,669 B1
(45) Date of Patent: Mar. 7, 2017

(54) SEMICONDUCTOR DEVICES AND SEMICONDUCTOR SYSTEMS

(71) Applicant: SK hynix Inc., Icheon-si, Gyeonggi-do (KR)

(72) Inventors: Young Hyun Baek, Icheon-si (KR); Bo Yeun Kim, Icheon-si (KR); Sang Hee Kim, Incheon (KR); Ji Eun Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/193,588

(22) Filed: Jun. 27, 2016

(30) Foreign Application Priority Data

Mar. 17, 2016 (KR) .......................... 10-2016-0032408

(51) Int. Cl.
| | |
|---|---|
| G11C 5/14 | (2006.01) |
| G11C 29/02 | (2006.01) |
| G11C 7/10 | (2006.01) |
| G11C 7/12 | (2006.01) |
| G11C 17/16 | (2006.01) |
| G11C 17/18 | (2006.01) |
| G11C 29/00 | (2006.01) |

(52) U.S. Cl.
CPC .......... *G11C 29/027* (2013.01); *G11C 5/148* (2013.01); *G11C 7/10* (2013.01); *G11C 7/12* (2013.01); *G11C 17/16* (2013.01); *G11C 17/18* (2013.01); *G11C 29/78* (2013.01)

(58) Field of Classification Search
CPC ..... G11C 13/0023; G11C 29/12; G11C 29/44; G11C 29/72
See application file for complete search history.

(56) References Cited

U.S. PATENT DOCUMENTS

| | | | | |
|---|---|---|---|---|
| 6,411,556 | B1* | 6/2002 | Amano | G11C 29/785 365/200 |
| 6,421,286 | B1* | 7/2002 | Ohtani | G11C 29/44 365/189.07 |
| 2001/0002884 | A1* | 6/2001 | Hiraki | G11C 7/08 365/185.09 |
| 2002/0001241 | A1* | 1/2002 | Hotaka | G11C 29/80 365/200 |
| 2002/0114198 | A1* | 8/2002 | Kato | G11C 29/26 365/200 |
| 2002/0167849 | A1* | 11/2002 | Ohbayashi | G11C 29/50 365/189.09 |
| 2003/0206452 | A1 | 11/2003 | Kato et al. | |

(Continued)

FOREIGN PATENT DOCUMENTS

KR 1020090088260 A 8/2009

*Primary Examiner* — Tuan T Nguyen
(74) *Attorney, Agent, or Firm* — William Park & Associates Ltd.

(57) ABSTRACT

A semiconductor system and semiconductor device may be provided. The semiconductor system may include a first semiconductor device configured to generate a test mode signal and configured to receive output data. The semiconductor system may include a second semiconductor device configured to enter a test mode, based on the test mode signal, and block the output data of data that is stored in redundancy memory cells connected to unrepaired redundancy word lines which are not used among redundancy word lines provided for replacing failed word lines.

22 Claims, 7 Drawing Sheets

(56) References Cited

U.S. PATENT DOCUMENTS

| | | | |
|---|---|---|---|
| 2008/0175079 A1* | 7/2008 | Jeon | G11C 29/02 365/200 |
| 2010/0157703 A1* | 6/2010 | Fischer | G11C 29/027 365/200 |
| 2013/0223133 A1* | 8/2013 | Azuma | G11C 13/0007 365/148 |
| 2016/0180969 A1* | 6/2016 | Noh | G11C 29/78 365/96 |

* cited by examiner

US 9,589,669 B1

SEMICONDUCTOR DEVICES AND SEMICONDUCTOR SYSTEMS

CROSS-REFERENCE TO RELATED APPLICATIONS

The present application claims priority under 35 U.S.C 119(a) to Korean Patent Application No. 10-2016-0032408, filed on Mar. 17, 2016, which is incorporated herein by reference in its entirety.

BACKGROUND

1. Technical Field

Embodiments of the present disclosure may generally relate to semiconductor devices testing redundancy word lines and semiconductor systems including the semiconductor devices.

2. Related Art

Each semiconductor device, such as semiconductor memory devices, may be designed to include fuses that store information necessary for various internal control operations. For example, internal control operations consist of various setting information or repair information on abnormal memory cells. General fuses can be programmed using laser beams at a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a MOS transistor. In such a case, data may be stored in the e-fuse by changing an electrical resistance value between a gate terminal and a source/drain terminal of the MOS transistor used as the e-fuse. That is, the e-fuse may be electrically opened or shorted according to a resistance value between the gate terminal and the source/drain terminal of the MOS transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. In the event that the e-fuse arrays are employed in the semiconductor devices, the e-fuse arrays may share amplifiers for amplifying the data stored in the e-fuses with each other. Accordingly, the integration density of the semiconductor devices may be improved.

SUMMARY

According to an embodiment, a semiconductor system may be provided. The semiconductor system may include a first semiconductor device configured to generate a test mode signal and configured to receive output data. The semiconductor system may include a second semiconductor device configured to enter a test mode, based on the test mode signal, and block the output data of data that is stored in redundancy memory cells connected to unrepaired redundancy word lines which are not used among redundancy word lines provided for replacing failed word lines.

According to an embodiment, a semiconductor device may be provided. The semiconductor device may include a memory area and an input/output (I/O) control circuit. The memory area may output data stored in redundancy memory cells connected to a redundancy word line replacing a failed word line as internal data, if a combination of a plurality of addresses is consistent with a combination for selecting the failed word line. The I/O control circuit may compare a plurality of fuse data generated according to electrical open/short states of fuses with the plurality of addresses to output the internal data as output data if the plurality of addresses has a combination for selecting the failed word line and to block outputting the internal data as the output data if the combination of the plurality of addresses is inconsistent with the combination for selecting the failed word line, based on any one of the plurality of fuse data.

DETAILED DESCRIPTION

Various embodiments of the present disclosure will be described hereinafter with reference to the accompanying drawings. However, the embodiments described herein are for illustrative purposes only and are not intended to limit the scope of the present disclosure. Further, the logic levels of the signals may be different from or the opposite of those described. For example, a signal described as having a logic "high" level may alternatively have a logic "low" level, and a signal described as having a logic "low" level may alternatively have a logic "high" level.

Various embodiments may be directed to semiconductor devices efficiently testing redundancy word lines by blocking output of data of the redundancy word lines that are not used in a test mode and semiconductor systems including the semiconductor devices.

Figure 1:
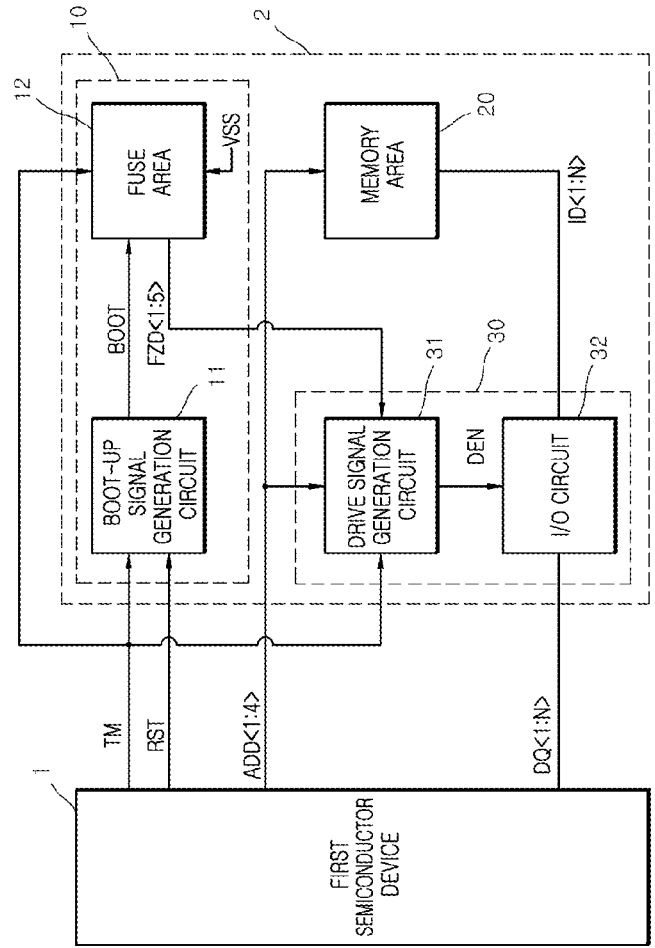
FIG. 1 is a block diagram illustrating a representation of an example of a configuration of a semiconductor system according to an embodiment of the present disclosure.

Referring to FIG. 1, a semiconductor system according to an embodiment of the present disclosure may include a first semiconductor device 1 and a second semiconductor device 2. The second semiconductor device 2 may include a fuse control circuit 10, a memory area 20, and an input/output (I/O) control circuit 30.

The first semiconductor device 1 may output a test mode signal TM, a reset signal RST, and first to fourth addresses ADD<1:4>. The first semiconductor device 1 may receive output data DQ<1:N> to detect a failure of redundancy word lines. The test mode signal TM may be enabled to enter a test mode that blocks the output of data that is stored in redundancy memory cells connected to unrepaired redundancy word lines which are not used among redundancy word lines provided for replacing failed word lines and that outputs only data stored in redundancy memory cells connected to repaired redundancy word lines which are used among the redundancy word lines. The reset signal RST may be set to be enabled when a semiconductor system performs an initial operation. The reset signal RST may be set to be enabled after a power-up period in which an internal voltage used in the semiconductor system rises up to a predetermined level in pursuance of a level of a power supply voltage supplied from an external device. Although the number of bits of the first to fourth addresses ADD<1:4> is set to be four, the present disclosure is not limited thereto. For example, in some embodiments, the number of bits of the first to fourth addresses ADD<1:4> may be set to be greater or less than four according to number of word lines included in the memory area 20. The first to fourth addresses ADD<1:4> may be transmitted through lines that transmit at least one group of addresses, commands and data. Here, for the purpose of ease and convenience in explanation, the first and second addresses ADD<1:2> among the first to fourth addresses ADD<1:4> may be set to addresses for selecting first to fourth mats (21 to 24 of FIG. 3) included in the memory area 20. In addition, the third and fourth addresses ADD<3:4> may be set to addresses for selecting the word lines included in the memory area 20.

The fuse control circuit 10 may include a boot-up signal generation circuit 11 and a fuse area 12.

The boot-up signal generation circuit 11 may generate a boot-up signal BOOT which is enabled in response to the test mode signal TM and the reset signal RST. The boot-up signal generation circuit 11 may generate the boot-up signal BOOT which is enabled, if the test mode signal TM is enabled to put the second semiconductor device 2 in a test mode. The boot-up signal generation circuit 11 may generate the boot-up signal BOOT which is enabled, if the reset signal RST is enabled after the initial operation or the power-up period.

The fuse area 12 may generate first to fifth fuse data FZD<1:5> according to electrical open/short states of a plurality of fuses, in response to the boot-up signal BOOT and the test mode signal TM. The fuse area 12 may output first and second counting signals (CNT<1:2> of FIG. 2) and a ground voltage VSS as the first to fourth fuse data FZD<1:4> in response to the boot-up signal BOOT and the test mode signal TM. The first to fourth fuse data FZD<1:4> among the first to fifth fuse data FZD<1:5> may include positional information on the failed word lines. The fifth fuse data FZD<5> among the first to fifth fuse data FZD<1:5> may include information on the electrical open/short states of the fuses. Descriptions of the fifth fuse data FZD<5> including the information on the electrical open/short states of the fuses will be developed in the following explanation.

The fuse control circuit 10 having an aforementioned configuration may output the first to fifth fuse data FZD<1:5> which are generated according to the electrical open/short states of the fuses, in response to the test mode signal TM and the reset signal RST.

The memory area 20 may output internal data ID<1:N> by replacing the failed word line with any one of the redundancy word lines, if a combination of the first to fourth addresses ADD<1:4> corresponds to a combination for selecting the failed word line in a test mode. The memory area 20 may output data of memory cells connected to a word line which is selected by the first to fourth addresses ADD<1:4> as the internal data ID<1:N> in a normal mode. The memory area 20 may include a plurality of mats having a plurality of word lines and a plurality of redundancy word lines.

The I/O control circuit 30 may include a drive signal generation circuit 31 and an I/O circuit 32.

The drive signal generation circuit 31 may compare the first to fourth addresses ADD<1:4> with the first to fifth fuse data FZD<1:5> to generate a drive signal DEN which is enabled, if a combination of the first to fourth addresses ADD<1:4> is consistent with a combination for selecting the failed word line.

The I/O circuit 32 may output the internal data ID<1:N> as the output data DQ<1:N> in response to the drive signal DEN. The I/O circuit 32 may be realized using a general driver and may output the internal data ID<1:N> as the output data DQ<1:N> if the drive signal DEN is enabled. The I/O circuit 32 may not output the internal data ID<1:N> as the output data DQ<1:N> if the drive signal DEN is disabled.

In the test mode, the I/O control circuit 30 having an aforementioned configuration may compare the first to fifth fuse data FZD<1:5> with the first to fourth addresses ADD<1:4> to output the internal data ID<1:N> as the output data DQ<1:N> if the first to fourth addresses ADD<1:4> select the failed word line. The I/O control circuit 30 may not output the internal data ID<1:N> as the output data DQ<1:N> if the first to fourth addresses ADD<1:4> do not select the failed word line in a test mode.

Figure 2:
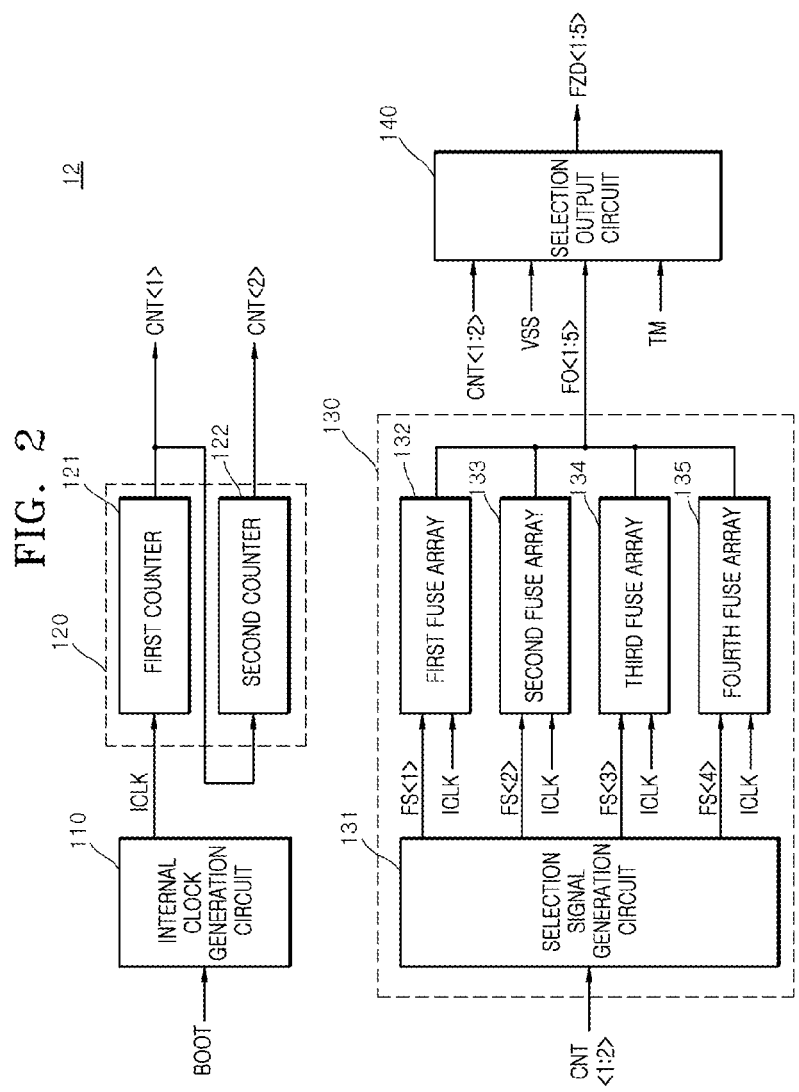
FIG. 2 is a block diagram illustrating a representation of an example of a configuration of a fuse area included in the semiconductor system of FIG. 1.

Referring to FIG. 2, the fuse area 12 may include an internal clock generation circuit 110, a counting signal generation circuit 120, a fuse circuit 130, and a selection output circuit 140.

The internal clock generation circuit 110 may generate an internal clock signal ICLK including pulses which are periodically generated, in response to the boot-up signal BOOT. The internal clock generation circuit 110 may generate the internal clock signal ICLK which is toggled in response to the boot-up signal BOOT.

The counting signal generation circuit 120 may include a first counter 121 and a second counter 122.

The first counter 121 may generate the first counting signal CNT<1> whose level is changed whenever the pulses of the internal clock signal ICLK are inputted to the first counter 121 by a predetermined number of times. The first counter 121 may generate the first counting signal CNT<1> whose level is changed whenever the internal clock signal ICLK is toggled by the predetermined number of times.

The second counter 122 may generate the second counting signal CNT<2> whose level is changed if a level of the first counting signal CNT<1> changes from a logic high level to a logic low level.

The first counter 121 and the second counter 122 may be realized using general counters.

The counting signal generation circuit 120 having an aforementioned configuration may generate the first and second counting signals CNT<1:2> which are sequentially counted in response to the pulses of the internal clock signal ICLK.

The fuse circuit 130 may include a selection signal generation circuit 131, a first fuse array 132, a second fuse array 133, a third fuse array 134, and a fourth fuse array 135.

The selection signal generation circuit 131 may decode the first and second counting signals CNT<1:2> to generate first to fourth selection signals FS<1:4>, one of which is selectively enabled. The selection signal generation circuit 131 may be realized using a general decoder.

For example, the selection signal generation circuit 131 may generate the first selection signal FS<1> which is enabled to have a logic high level if the first counting signal CNT<1> has a logic low level and the second counting signal CNT<2> has a logic low level. The selection signal generation circuit 131 may generate the second selection signal FS<2> which is enabled to have a logic high level if the first counting signal CNT<1> has a logic high level and the second counting signal CNT<2> has a logic low level. The selection signal generation circuit 131 may generate the third selection signal FS<3> which is enabled to have a logic high level if the first counting signal CNT<1> has a logic low level and the second counting signal CNT<2> has a logic high level. The selection signal generation circuit 131 may generate the fourth selection signal FS<4> which is enabled to have a logic high level if the first counting signal CNT<1> has a logic high level and the second counting signal CNT<2> has a logic high level.

The first fuse array 132 may include a plurality of fuses and may generate first to fifth fuse output signals FO<1:5> according to the electrical open/short states of the fuses in response to the pulses of the internal clock signal ICLK if the first selection signal FS<1> is enabled.

The second fuse array 133 may include a plurality of fuses and may generate the first to fifth fuse output signals FO<1:5> according to the electrical open/short states of the fuses in response to the pulses of the internal clock signal ICLK if the second selection signal FS<2> is enabled.

The third fuse array 134 may include a plurality of fuses and may generate the first to fifth fuse output signals FO<1:5> according to the electrical open/short states of the fuses in response to the pulses of the internal clock signal ICLK if the third selection signal FS<3> is enabled.

The fourth fuse array 135 may include a plurality of fuses and may generate the first to fifth fuse output signals FO<1:5> according to the electrical open/short states of the fuses in response to the pulses of the internal clock signal ICLK if the fourth selection signal FS<4> is enabled.

Each of the first to fourth fuse arrays 132 to 135 may be realized to include a fuse array in which a plurality of e-fuses are arrayed.

The fifth fuse output signal FO<5> among the first to fifth fuse output signals FO<1:5> may include information on the electrical open/short states of the fuses included in the fuse array. For example, if the fifth fuse output signal FO<5> is enabled to have a logic high level, it means that the fuses included in the fuse array are cut off and the first to fourth fuse output signals FO<1:4> are generated. For example, if the fifth fuse output signal FO<5> is disabled to have a logic low level, it means that the fuses included in the fuse array are not cut off and the first to fourth fuse output signals FO<1:4> are not generated.

The fuse circuit 130 having an aforementioned configuration may generate the first to fifth fuse output signals FO<1:5> according to the electrical open/short states of the fuses included in the fuse array which is selected in response to the first and second counting signals CNT<1:2>.

The selection output circuit 140 may output the first to fifth fuse output signals FO<1:5> as the first to fifth fuse data FZD<1:5> or may output the first and second counting signals CNT<1:2>, the ground voltage VSS and the fifth fuse output signal FO<5> as the first to fifth fuse data FZD<1:5>, in response to the test mode signal TM. The selection output circuit 140 may output the first to fifth fuse output signals FO<1:5> as the first to fifth fuse data FZD<1:5>, if the test mode signal TM is disabled. If the test mode signal TM is enabled, the selection output circuit 140 may output the first and second counting signals CNT<1:2> as the first and second fuse data FZD<1:2>, may output the ground voltage VSS as the third and fourth fuse data FZD<3:4>, and may output the fifth fuse output signal FO<5> as the fifth fuse data FZD<5>. That is, the fifth fuse data FZD<5> among the first to fifth fuse data FZD<1:5> may include information on the electrical open/short states of the fuses included in the fuse array. In some embodiments, fuse data including the information on the electrical open/short states of the fuses may be expressed by any one of the first to fourth fuse data FZD<1:4>.

Figure 3:
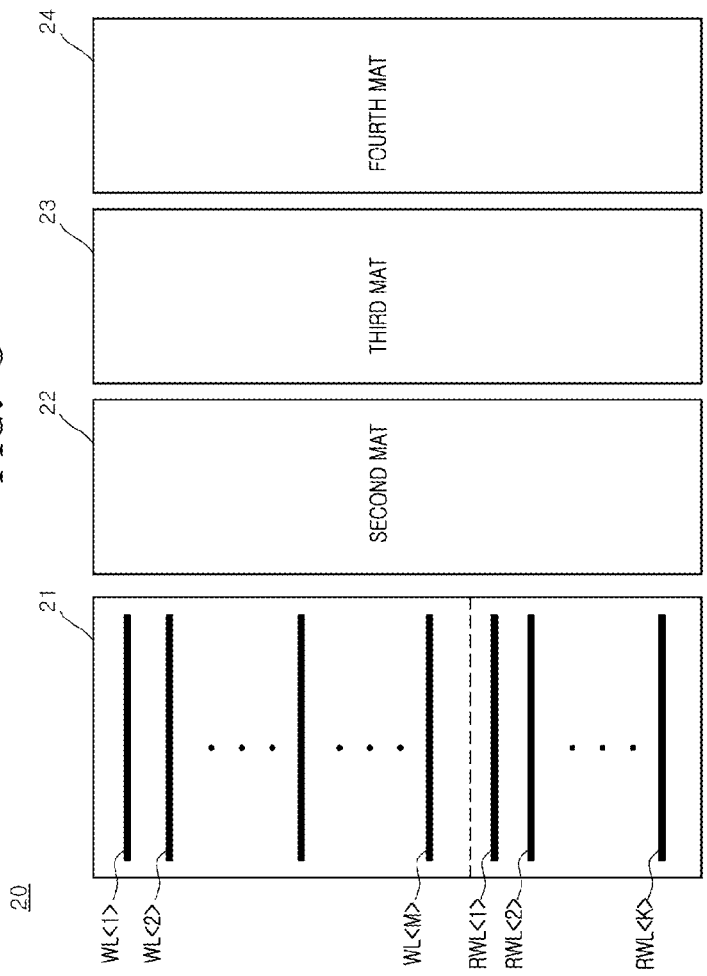
FIG. 3 is block diagram illustrating a representation of an example of a configuration of a memory area included in the semiconductor system of FIG. 1.

Referring to FIG. 3, the memory area 20 may include a first mat 21, a second mat 22, a third mat 23, and a fourth mat 24.

The first mat 21 may include first to $M^{th}$ word lines WL<1:M> and first to $K^{th}$ redundancy word lines RWL<1:K>. The first mat 21 may include a plurality of memory cells and may receive or output the internal data ID<1:N>. The first to $M^{th}$ word lines WL<1:M> may be lines for selecting memory cells storing the internal data ID<1:N>. A failed word line, which is connected to at least one failed memory cell, among the first to $M^{th}$ word lines WL<1:M> may be replaced with any one of the first to $K^{th}$ redundancy word lines RWL<1: K>.

Each of the second to fourth mats 22 to 24 may have the same configuration as the first mat 21 and may perform the same operation as the first mat 21. Thus, descriptions of the second to fourth mats 22 to 24 will be omitted hereinafter.

Figure 4:
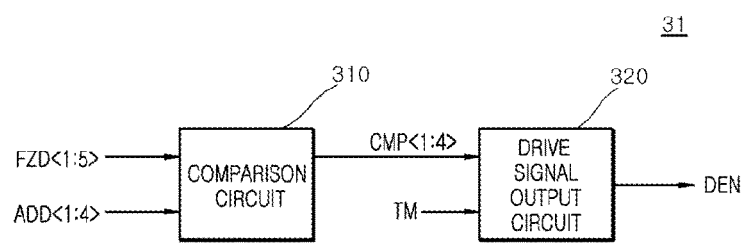
FIG. 4 is a block diagram illustrating a representation of an example of a configuration of a drive signal generation circuit included in the semiconductor system of FIG. 1.

Referring to FIG. 4, the drive signal generation circuit 31 may include a comparison circuit 310 and a drive signal output circuit 320.

The comparison circuit 310 may compare the first to fifth fuse data FZD<1:5> with the first to fourth addresses ADD<1:4> to generate first to fourth comparison signals CMP<1:4>. An operation of generating the first to fourth comparison signals CMP<1:4> in the comparison circuit 310 will be described more fully with reference to FIG. 5.

The drive signal output circuit 320 may generate the drive signal DEN which is enabled if any one of the first to fourth comparison signals CMP<1:4> is enabled, in response to the test mode signal TM. An operation of generating the drive signal DEN in the drive signal output circuit 320 will be described more fully with reference to FIG. 6.

Figure 5:
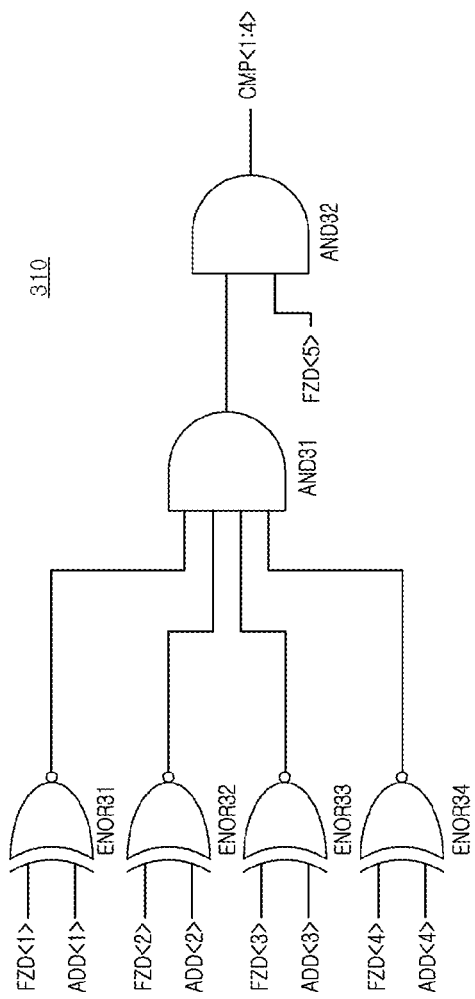
FIG. 5 is a circuit diagram of a representation of an example of a comparison circuit included in the drive signal generation circuit of FIG. 4.

Referring to FIG. 5, the comparison circuit 310 may include logic gates, for example but not limited to, exclusive NOR gates ENOR31, ENOR32, ENOR33 and ENOR34 as well as AND gates AND31 and AND32.

The exclusive NOR gate ENOR31 may generate an output signal having a logic high level, if the first fuse data FZD<1> and the first address ADD<1> have the same logic level.

The exclusive NOR gate ENOR32 may generate an output signal having a logic high level, if the second fuse data FZD<2> and the second address ADD<2> have the same logic level.

The exclusive NOR gate ENOR33 may generate an output signal having a logic high level, if the third fuse data FZD<3> and the third address ADD<3> have the same logic level.

The exclusive NOR gate ENOR34 may generate an output signal having a logic high level, if the fourth fuse data FZD<4> and the fourth address ADD<4> have the same logic level.

The AND gate AND31 may generate an output signal having a logic high level, if all of the output signals of the exclusive NOR gate ENOR31, ENOR32, ENOR33, and ENOR34 have a logic high level.

The AND gate AND32 may generate the first to fourth comparison signals CMP<1:4> having a logic high level, if the fifth fuse data FZD<5> has a logic high level and the output signal of the AND gate AND31 has a logic high level.

For the purpose of ease and convenience in explanation, it may be assumed that the first to fourth comparison signals CMP<1:4> have four bits. In such a case, the first comparison signal CMP<1> may correspond to a signal which is generated by comparing the first to fifth fuse data FZD<1:5> generated from the first fuse array 132 with the first to fourth addresses ADD<1:4>, the second comparison signal CMP<2> may correspond to a signal which is generated by comparing the first to fifth fuse data FZD<1:5> generated from the second fuse array 133 with the first to fourth addresses ADD<1:4>, the third comparison signal CMP<3> may correspond to a signal which is generated by comparing the first to fifth fuse data FZD<1:5> generated from the third fuse array 134 with the first to fourth addresses ADD<1:4>, and the fourth comparison signal CMP<4> may correspond to a signal which is generated by comparing the first to fifth fuse data FZD<1:5> generated from the fourth fuse array 135 with the first to fourth addresses ADD<1:4>.

Figure 6:
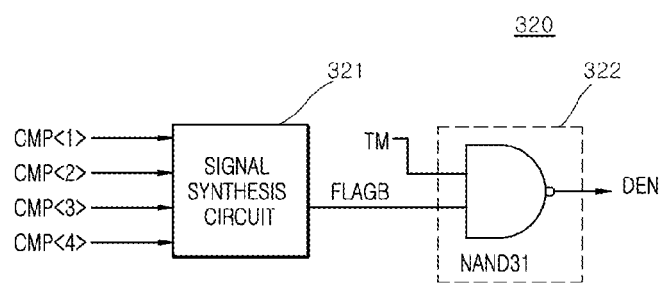
FIG. 6 is a block diagrams illustrating a representation of an example of a configuration of a drive signal output circuit included in the drive signal generation circuit of FIG. 4.

Referring to FIG. 6, the drive signal output circuit 320 may include a signal synthesis circuit 321 and a logic circuit 322.

The signal synthesis circuit 321 may generate a flag signal FLAGB which is enabled to have a logic low level, if any one of the first to fourth comparison signals CMP<1:4> has a logic high level. The signal synthesis circuit 321 may generate the flag signal FLAGB which is disabled to have a logic high level, if all of the first to fourth comparison signals CMP<1:4> have a logic low level.

The logic circuit 322 may be realized using a logic gate, for example but not limited to, a NAND gate NAND31 and may generate the drive signal DEN which is disabled to have a logic low level if the test mode signal TM is enabled to have a logic high level and the flag signal FLAGB is disabled to have a logic high level. The logic circuit 322 may generate the drive signal DEN which is enabled to have a logic high level if the test mode signal TM is enabled to have a logic high level and the flag signal FLAGB is enabled to have a logic low level.

An operation of testing the redundancy word lines of a semiconductor system illustrated in FIGS. 1 to 6 will be described hereinafter in conjunction with an example in which the redundancy word lines of the first mat 21 are used to replace failed word lines and the redundancy word lines of the second mat 22 are not used.

First, a test mode in which the redundancy word lines of the first mat 21 are used to replace the failed word lines will be described hereinafter.

The first semiconductor device 1 may output the test mode signal TM, the reset signal RST, and the first to fourth addresses ADD<1:4> to put the second semiconductor device 2 in the test mode.

The boot-up signal generation circuit 11 may generate the boot-up signal BOOT which is enabled in response to the test mode signal TM.

The fuse area 12 may generate the first to fifth fuse data FZD<1:5> according to the electrical open/short states of the fuses in response to the boot-up signal BOOT. In such a case, the first to fourth fuse data FZD<1:4> among the first to fifth fuse data FZD<1:5> may include positional information on a failed word line, and the fifth fuse data FZD<5> may be generated to have a logic high level since the fuses are cut off to generate the first to fourth fuse data FZD<1:4>. Here, if the fifth fuse data FZD<5> having a logic high level is generated, it means that the redundancy word line is used to replace the failed word line.

The memory area 20 may output the data stored in redundancy memory cells connected to the redundancy word line of the first mat 21 as the internal data ID<1:N>.

The drive signal generation circuit 31 may compare the first to fourth addresses ADD<1:4> with the first to fifth fuse data FZD<1:5> to generate the drive signal DEN which is enabled to have a logic high level, if a combination of the first to fourth addresses ADD<1:4> is consistent with a combination for selecting the failed word line.

The I/O circuit 32 may output the internal data ID<1:N> as the output data DQ<1:N> in response to the drive signal DEN having a logic high level.

The first semiconductor device 1 may detect logic levels of the output data DQ<1:N> to sense a failure of the redundancy word lines.

Next, a test mode in which the redundancy word lines of the second mat 22 are not used will be described hereinafter.

The first semiconductor device 1 may output the test mode signal TM, the reset signal RST and the first to fourth addresses ADD<1:4> to put the second semiconductor device 2 in the test mode.

The boot-up signal generation circuit 11 may generate the boot-up signal BOOT which is enabled in response to the test mode signal TM.

The fuse area 12 may generate the first to fifth fuse data FZD<1:5> according to the electrical open/short states of the fuses in response to the boot-up signal BOOT. In such a case, the first to fourth fuse data FZD<1:4> among the first to fifth fuse data FZD<1:5> may not be generated if there is no failed word line, and the fifth fuse data FZD<5> may be generated to have a logic low level since the fuses are not cut off not to generate the first to fourth fuse data FZD<1:4>. If the fifth fuse data FZD<5> having a logic low level is generated, it means that the redundancy word line is not used.

The memory area 20 may output the data stored in the redundancy memory cells connected to the redundancy word line of the second mat 22 as the internal data ID<1:N>.

The drive signal generation circuit 31 may compare the first to fourth addresses ADD<1:4> with the first to fifth fuse data FZD<1:5> to generate the drive signal DEN which is disabled to have a logic low level, since a combination of the first to fourth addresses ADD<1:4> is not consistent with a combination for selecting the failed word line.

The I/O circuit 32 may not output the internal data ID<1:N> as the output data DQ<1:N> in response to the drive signal DEN having a logic low level.

The first semiconductor device 1 may not sense a failure of the redundancy word lines, since the output data DQ<1:N> is not outputted from the I/O circuit 32.

The semiconductor system having the aforementioned configurations may output the data stored in redundancy memory cells connected to the redundancy word lines which are used and may block output of the data stored in redundancy memory cells connected to the redundancy word lines which are not used. Accordingly, it maybe possible to efficiently test the redundancy word lines.

The second semiconductor devices or the semiconductor systems described with reference to FIGS. 1 to 6 may be applied to an electronic system that includes a memory system, a graphic system, a computing system, a mobile system, or the like. For example, referring to FIG. 7, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include a second semiconductor device 2 illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 7:
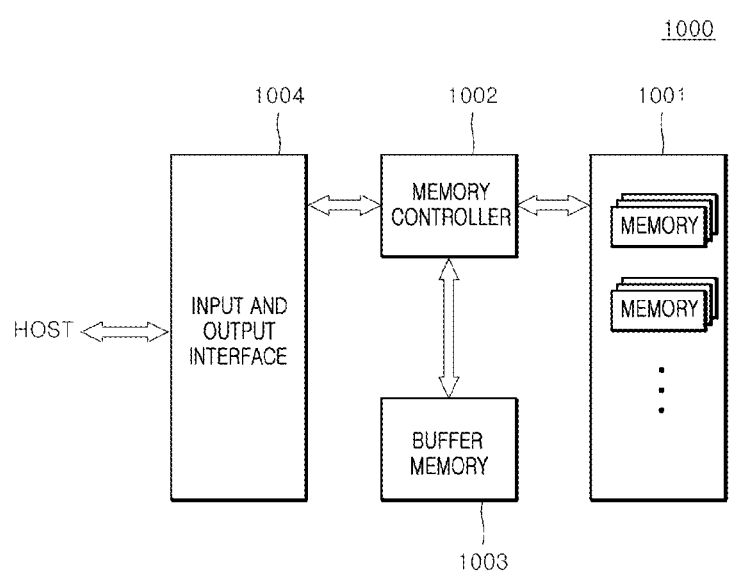
FIG. 7 is a block diagram illustrating a representation of an example of a configuration of an electronic system employing the second semiconductor device or the semiconductor system illustrated in FIG. 1 to FIG. 6.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include a first semiconductor device 1 illustrated in FIG. 1. Although FIG. 7 illustrates the memory controller 1002 with a single block, the memory controller 1002 may include one controller for controlling a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM). In some embodiments, the buffer memory 1003 may include a second semiconductor device 2 illustrated in FIG. 1.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the present disclosure, it may be possible to efficiently test redundancy word lines by blocking output of data stored in redundancy memory cells connected to the redundancy word lines which are not used, in a test mode.

What is claimed is:

1. A semiconductor system comprising:
   a first semiconductor device configured to output a test mode signal, a reset signal and a plurality of addresses and configured to receive output data; and
   a second semiconductor device configured to compare a plurality of fuse data with the plurality of addresses in response to the test mode signal and the reset signal and configured to output data stored in redundancy memory cells connected to a repaired redundancy word line which is used among redundancy word lines as the output data and to block the output of data stored in redundancy memory cells connected to an unrepaired redundancy word line which is not used among the redundancy word lines, if a combination of the plurality of addresses is consistent with a combination for selecting a failed word line.

2. The semiconductor system of claim 1, wherein the first semiconductor device detects levels of the output data to sense a failure of the redundancy word lines.

3. The semiconductor system of claim 1, wherein the test mode signal is enabled to put the second semiconductor device in a test mode that blocks output of the data stored in the redundancy memory cells connected to the unrepaired redundancy word line and that outputs the data stored in the redundancy memory cells connected to the repaired redundancy word line replacing the failed word line.

4. The semiconductor system of claim 1, wherein the second semiconductor device includes:
   a fuse control circuit configured to output the plurality of fuse data which is generated according to electrical open/short states of fuses in response to the test mode signal and the reset signal;
   a memory area configured to output internal data by replacing the failed word line with the repaired redundancy word line if the combination of the plurality of addresses is consistent with a combination for selecting the failed word line; and
   an input/output (input and output)(I/O) control circuit configured to compare the plurality of fuse data with the plurality of addresses to output the internal data as the output data if the plurality of addresses has a combination for selecting the failed word line and to block outputting the internal data as the output data if the combination of the plurality of addresses is not consistent with the combination for selecting the failed word line.

5. The semiconductor system of claim 4, wherein the fuse control circuit includes:

a boot-up signal generation circuit configured to generate a boot-up signal which is enabled in response to the test mode signal and the reset signal; and a fuse area configured to generate the plurality of fuse data according to the electrical open/short states of the fuses in response to the boot-up signal.

6. The semiconductor system of claim 5, wherein one of the plurality of fuse data includes information on the electrical open/short states of the fuses.

7. The semiconductor system of claim 5, wherein the fuse area includes:

an internal clock generation circuit configured to generate an internal clock signal including pulses which are periodically generated in response to the boot-up signal;

a counting signal generation circuit configured to generate first and second counting signals which are sequentially counted in response to the pulses of the internal clock signal;

a fuse circuit configured to generate fuse output signals according to the electrical open/short (open and short) states of the fuses included in one of fuse arrays, which is selected in response to the first and second counting signals; and a selection output circuit configured to output the fuse output signals as the fuse data if the test mode signal is disabled and configured to output the first and second counting signals and one of the fuse output signals including information on the electrical open/short states of the fuses as the fuse data if the test mode signal is enabled.

8. The semiconductor system of claim 4, wherein the I/O control circuit includes:

a drive signal generation circuit configured to compare the plurality of addresses with the plurality of fuse data to generate a drive signal which is enabled if the combination of the plurality of addresses is consistent with the combination for selecting the failed word line; and an input/output (I/O) circuit configured to output the internal data as the output data in response to the drive signal.

9. The semiconductor system of claim 8, wherein the drive signal generation circuit includes:

a comparison circuit configured to compare the plurality of addresses with the plurality of fuse data to generate a plurality of comparison signals; and a drive signal output circuit configured to generate the drive signal which is enabled in response to the test mode signal if any one of the plurality of comparison signals is enabled.

10. The semiconductor system of claim 9, wherein the plurality of comparison signals are disabled if one of the fuse data including information on the electrical open/short states of the fuses is enabled.

11. The semiconductor system of claim 9, wherein the drive signal output circuit includes:

a signal synthesis circuit configured to generate a flag signal which is enabled if one of the plurality of comparison signals is enabled; and a logic circuit configured to generate the drive signal which is enabled in response to the test mode signal if the flag signal is enabled.

12. A semiconductor device comprising:

a memory area configured to output data stored in redundancy memory cells connected to a redundancy word line replacing a failed word line as internal data, if a combination of a plurality of addresses is consistent with a combination for selecting the failed word line; and an input/output (input and output) (I/O) control circuit configured to compare a plurality of fuse data generated according to electrical open/short (open and short) states of fuses with the plurality of addresses to output the internal data as output data if the plurality of addresses has a combination for selecting the failed word line and to block outputting the internal data as the output data if the combination of the plurality of addresses is inconsistent with the combination for selecting the failed word line, in response to any one of the plurality of fuse data.

13. The semiconductor device of claim 12, wherein the output data include information on a failure of the redundancy word line.

14. The semiconductor device of claim 12, wherein one of the plurality of fuse data includes information on the electrical open/short states of the fuses.

15. The semiconductor device of claim 12, wherein the I/O control circuit includes:

a drive signal generation circuit configured to compare the plurality of addresses with the plurality of fuse data to generate a drive signal which is enabled if the combination of the plurality of addresses is consistent with the combination for selecting the failed word line; and an input/output (I/O) circuit configured to output the internal data as the output data in response to the drive signal.

16. The semiconductor device of claim 15, wherein the drive signal generation circuit includes:

a comparison circuit configured to compare the plurality of addresses with the plurality of fuse data to generate a plurality of comparison signals; and a drive signal output circuit configured to generate the drive signal which is enabled in response to a test mode signal, if any one of the plurality of comparison signals is enabled.

17. The semiconductor device of claim 16, wherein the plurality of comparison signals are disabled if one of the plurality of fuse data including information on the electrical open/short states of the fuses is enabled.

18. The semiconductor device of claim 16, wherein the drive signal output circuit includes:

a signal synthesis circuit configured to generate a flag signal which is enabled if one of the plurality of comparison signals is enabled; and a logic circuit configured to generate the drive signal which is enabled in response to the test mode signal if the flag signal is enabled.

19. The semiconductor device of claim 12, further comprising a fuse control circuit configured to output the plurality of fuse data which is generated according to the open/short states of the fuses in response to a test mode signal and a reset signal.

20. The semiconductor device of claim 19, wherein the fuse control circuit includes:

a boot-up signal generation circuit configured to generate a boot-up signal which is enabled in response to the test mode signal and the reset signal; and a fuse area configured to generate the plurality of fuse data according to the electrical open/short states of the fuses in response to the boot-up signal.

21. A semiconductor system comprising:

a first semiconductor device configured to generate a test mode signal and configured to receive output data; and a second semiconductor device configured to enter a test mode, based on the test mode signal, and block the output data of data that is stored in redundancy memory cells connected to unrepaired redundancy word lines which are not used among redundancy word lines provided for replacing failed word lines.

22. The semiconductor system of claim 21, wherein the second semiconductor device, based on the test mode signal, is configured to output only data stored in redundancy memory cells connected to repaired redundancy word lines which are used among the redundancy word lines.

* * * * *